US006802985B1

(12) United States Patent
Chikama et al.

(10) Patent No.: US 6,802,985 B1
(45) Date of Patent: Oct. 12, 2004

(54) METHOD FOR FABRICATING METAL WIRINGS

(75) Inventors: Yoshimasa Chikama, Souraku-gun (JP); Yoshihiro Izumi, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 37 days.

(21) Appl. No.: 09/648,657

(22) Filed: Aug. 25, 2000

(30) Foreign Application Priority Data

Aug. 26, 1999 (JP) .......................................... 11-239682
Jul. 6, 2000 (JP) ....................................... 2000-205190

(51) Int. Cl.[7] .............................................. C25D 5/54
(52) U.S. Cl. ........................... 216/13; 216/34; 216/83; 205/86; 205/166; 205/167; 205/169; 205/183; 205/184; 427/96; 427/98; 427/165; 427/305; 427/306; 427/555; 427/581; 427/126.5; 427/126.6
(58) Field of Search .................... 205/86, 166–169, 205/183–187, 210, 220, 223; 216/13, 34, 83; 427/96, 98, 165, 168, 169, 305, 306, 553, 555, 581, 126.5, 126.6

(56) References Cited

U.S. PATENT DOCUMENTS

| | | | | |
|---|---|---|---|---|
| 4,629,681 A | * | 12/1986 | Takada et al. | 430/314 |
| 4,643,798 A | * | 2/1987 | Takada et al. | 216/20 |
| 5,156,731 A | * | 10/1992 | Ogasawara et al. | 205/126 |
| 5,156,732 A | * | 10/1992 | Ogasawara et al. | 205/126 |
| 5,246,564 A | * | 9/1993 | Tamiya et al. | 205/169 |
| 5,300,813 A | * | 4/1994 | Joshi et al. | 257/751 |
| 5,310,580 A | * | 5/1994 | O'Sullivan et al. | 427/307 |
| 5,323,534 A | * | 6/1994 | Iwasaki et al. | 29/850 |
| 5,516,983 A | * | 5/1996 | Kishimoto et al. | 174/1 |
| 6,303,278 B1 | * | 10/2001 | Larsson et al. | 430/324 |
| 6,518,676 B2 | * | 2/2003 | Chikama et al. | 257/775 |

FOREIGN PATENT DOCUMENTS

| | | | | | |
|---|---|---|---|---|---|
| JP | 62222855 A | * | 9/1987 | | |
| JP | 03101233 A | * | 4/1991 | ......... | H01L/21/321 |
| JP | 04099283 A | * | 3/1992 | | |
| JP | 05090737 A | * | 4/1993 | | |
| JP | 06316768 A | * | 11/1994 | | |
| JP | 10245444 A | * | 9/1998 | | |
| KR | 1993-18660 | | 9/1993 | ........... | H01L/21/28 |

* cited by examiner

*Primary Examiner*—Anita Alanko
(74) *Attorney, Agent, or Firm*—David G. Conlin; John B. Alexander; Edwards & Angell, LLP

(57) ABSTRACT

There is provided a method for fabricating electrical wirings capable of being manufactured with low cost and easily applied to large-scale substrates. A photosensitive ground resin film is formed on an insulating substrate by coating process. The ground resin film is subjected to exposure and development processes, by which a ground resin film patterned into a wiring pattern is obtained. Then, on the patterned ground resin film, a low-resistance metal film made of Cu is formed by electroless plating.

13 Claims, 3 Drawing Sheets

METHOD FOR FABRICATING METAL WIRINGS

BACKGROUND OF THE INVENTION

The present invention relates to a method for fabricating metal wirings used for flat panel displays such as liquid crystal displays (LCDs), plasma display panels (PDPs), electrochromic displays (ECDs) and electroluminescent displays (ELDs), printed wiring boards using ceramic boards, and other various fields.

Conventionally, in a flat panel display typified by LCDs, normally, display material such as liquid crystals is held between a pair of substrates and a voltage is applied to this display material. In this case, electrical wiring lines are arrayed on at least one of the substrates.

For example, in the case of an active matrix drive type LCD, on one of a pair of substrates constituting part of a display unit, gate electrodes and data electrodes are disposed in a matrix shape, and thin film transistors (TFTs) and pixel electrodes are disposed at individual intersections of these electrodes. Normally, these gate electrodes and data electrodes are made of a metal material such as Ta, Al or Mo, and deposited by a dry film formation process such as sputtering process.

In such flat panel displays, in an attempt to implement larger areas and higher definitions, the drive frequency would increase while the electric wiring resistance as well as the parasitic capacitance would increase. As a result of this, delay of driving signals would come up as a large problem.

Thus, in order to solve the problem of the delay of driving signals, there have been made attempts to use Cu (bulk resistivity: 1.7 $\mu\Omega\cdot$cm), which is lower in electrical resistance, instead of Al (bulk resistivity: 2.7 $\mu\Omega\cdot$cm), $\alpha$-Ta (bulk resistivity: 13.1 $\mu\Omega\cdot$cm) or Mo (bulk resistivity: 5.8 $\mu\Omega\cdot$cm), which are conventional wiring materials. For example, "Low Resistance Copper Address Line for TFT-LCD" (Japan Display '89, pp. 498–501) discloses discussion results on a case of using Cu as the gate electrode material of TFT-LCDs. According to this literature, it is expressly described out that because a Cu film deposited by sputtering process is poor in adhesion with the ground glass, a metal film of Ta or the like needs to be interveniently provided as a ground film in order to enhance the adhesion.

However, in the case of the wiring structure in which a metal film of Ta or the like is provided as the ground, dry formation processes and etching processes would be involved individually for the Cu film and the ground metal film of Ta or the like, causing a process increase and leading to a cost increase, as a disadvantage.

Thus, in Japanese Patent Laid-Open Publication HEI 4-232922, there has been proposed a method in which while a transparent electrode made of ITO (Indium-Tin-oxide) or the like is used as a ground film, a metal film of Cu or the like is formed by plating technique on the ground film. In this technique, it is expressly described that since the plated metal can be formed selectively only on the ITO film, the patterning process is required only for the ITO film of the transparent electrode so that Cu wiring can effectively be formed even for large areas. The publication also describes that a metal film of Ni or the like having good adhesion with the ITO film is interveniently provided between the ITO film and Cu wiring.

On the other hand, in addition to the electrical wiring fabricating method described in Japanese Patent Laid-Open Publication HEI 4-232922, there have been proposed electrical wiring fabricating methods in which a film of Ni, Au, Cu or other metal is formed on a patterned ITO film by plating technique for various purposes such as the process reduction for the active matrix substrate, lower resistance of the transparent conductive film in simple matrix type LCDs or the like, and improvement solder wettability on the ITO film (see, e.g., Japanese Patent Laid-Open Publications HEI 2-83533, HEI 2-223924, HEI 1-96383, SHO 62-288883).

However, in the case where the Cu/Ta lamination film is formed by sputtering process, i.e., where both the Cu film for lower resistance and the ground metal film intended to improve the adhesion with the Cu film are formed by vacuum deposition equipment, individual film deposition processes are involved for the Cu film and the ground metal film, respectively, causing a process increase and leading to a cost increase, as a disadvantage. Also, individual etching processes are involved for the Cu film and the ground metal film, respectively, causing a process increase and leading to a cost increase, as a disadvantage.

Also, in the electrical wiring fabricating method in which ITO is used for the ground metal film, because the metal film is formed by wet formation technique while the ITO film is formed by vacuum deposition equipment for sputtering process, vapor deposition process or the like, enough cost reduction effect cannot be obtained, resulting in a problem that large-scale substrates cannot be easily managed.

SUMMARY OF THE INVENTION

Therefore, an object of the present invention is to provide an electrical wiring fabricating method capable of fabricating the electrical wiring with low cost without using any vacuum deposition and managing large-scale substrates.

In order to achieve the above object, the present invention provides a method for fabricating metal wirings, comprising the steps of:

forming a ground resin film by applying a resin onto an insulating substrate;

patterning the ground resin film; and forming a low-resistance metal film selectively on the patterned ground resin film by a wet film formation technique.

According to this invention, the ground resin film can be formed by spin coating, like resist or the like. The low-resistance metal film provided thereon can be formed selectively on the ground resin film by a wet film formation technique. Therefore, the need for vacuum deposition equipment, etching equipment or the like is eliminated.

As a result, it becomes possible to form metal wirings without using any vacuum deposition equipment, thus allowing a considerable cost reduction to be achieved as compared with the case where electrical wirings are formed by the method shown in the prior art example.

Also, since the ground film is made of resin, the film having good adhesion can be easily formed on the insulating substrate.

Further, since a wet film formation technique is used for film formation, the film formation can be achieved only by immersing the substrate into a solution, thus easily coping with large-scale substrates.

The wet film formation technique herein referred to is a technique that film formation is done by immersing the substrate into a solution without using any vacuum equipment, the technique being exemplified by plating process, electrolytic process, dip coating process, coating process or the like. In addition, such a film formation technique as shown in later-described Japanese Patent Laid-Open Publication HEI 10-245444 is also included in the scope of the wet film formation technique.

In one embodiment, the ground resin film is made of a photosensitive resin that can be patterned by exposure and development.

According to this embodiment, in addition to the foregoing effects, it becomes possible to easily form a high-definition film, as in the case of photoresist that is currently used. By using such a resin as those used for printed wiring boards, the ground resin film can be provided as a ground film that allows a single low-resistance metal film of, for example, Cu to be formed with good adhesion.

In one embodiment, the low-resistance metal film is a single layer film containing any one of Cu, Ni and Au or a multilayer film containing at least one of these single layers.

According to this embodiment, the low-resistance metal film is made of Cu, which has characteristics of low resistivity (bulk resistivity: 1.7 $\mu\Omega\cdot$cm) and long life against electromigration, thus optimum as a wiring material.

Also, even with low adhesion between Cu and ground resin, low-resistance wirings of good adhesion with the ground resin can be achieved by using Ni of good adhesion as the ground and forming Cu/Au or the like thereon.

In one embodiment, the ground resin film is made of polyimide.

Since polyimide is superior in heat resistance and chemical resistance among resins, using polyimide as the ground resin as in the metal wiring fabricating method of this embodiment allows a manufacturing method to be chosen from a wide variety of methods for the processes subsequent to the formation of the ground resin film.

For example, when plating process is used as the wet film formation process for forming the low-resistance metal film, the plating solution is in many cases strong alkali or strong acid. Therefore, high chemical resistance is effective for that process.

Also, polyimide, because of its high heat resistance, allows the margin for other film formation processes to be widely taken. For example, while the process maximum temperature for normal amorphous liquid crystals is about 350° C., polyimide has a heat resistance of about 400° C. (polyimide is normally thermally cured at about 350° C.; thermal decomposition temperature of polyimide is, in many cases, not less than 450° C.). Therefore, unlike the cases where other resins are used, there is no need of lowering the process temperature. The unnecessity of process change prevents occurrence of failures that would be involved in necessity of process changes, thus giving a large advantage for manufacture of products.

In addition, thermal resistance temperature of other resins is about 200° C. for normal resist that is used for liquid crystals, and not more than 250° C. for acrylic resin.

Also, some photosensitive polyimides have a resolution of L/S=5 $\mu$m or more, which is a satisfactory resolution as the ground material of the low-resistance metal for forming metal wirings.

Also, plated copper on polyimide has been already put into practical use in the field of printed boards or the like, thus satisfactory as the ground film in view of using plating process as the wet film formation technique.

In one embodiment, plating is used as the wet film formation technique, and the ground resin contains a plating catalyst.

According to this embodiment, since the plating catalyst is contained, it becomes possible to use a resin to which it is hard to selectively impart the plating catalyst.

Also, in the case of a resin that allows the plating catalyst to be easily imparted thereto, the step of imparting the catalyst during the plating process can be omitted, thus allowing process reduction to be easily achieved, as an advantage.

One embodiment further comprises a step for, before the step of forming the low-resistance metal film, modifying a surface of the ground resin film.

According to this embodiment, the surface of the ground resin film is modified, thereby forming asperity on the surface of the ground resin film. By the asperity formed on the surface of the ground resin film, the adhesion between the ground resin film and the low-resistance metal film can be improved to such an extent as could not be obtained by the catalyst imparting method used as a pre-processing for conventional plating process.

Also, as the surface of the modified ground resin film is highly capable of adsorbing metal ions, reducing these metal ions allows a metal layer to be obtained on the surface of the ground resin film. That is, a metal film that acts as a catalyst in the process of forming the low-resistance metal film can be formed selectively on the ground resin film without adding any patterning process such as photolithography process.

One embodiment further comprises a step for, after the step of modifying the surface of the patterned ground resin film, forming on the surface-modified ground resin film a metal layer serving as a catalyst in the process of forming the low-resistance metal film by the wet film formation technique.

According to this embodiment, a metal layer is formed on the ground resin film. This metal layer acts as a catalyst in the process of forming the low-resistance metal film on the ground resin film by, for example, electroless plating process as a wet film formation process. Since the metal layer is easily formed on the modified ground resin film as described above, resin materials to which the plating catalyst is hard to selectively impart become usable as the ground resin, thus allowing the material of the ground resin film to be chosen from a wider variety of materials, so that the material cost of the ground resin becomes lower. Also, since the step of imparting the catalyst in the plating process can be omitted even with the use of a resin to which a plating catalyst is easily imparted, the metal wiring manufacturing processes can be reduced.

In one embodiment, the step of forming the metal layer acting as a catalyst in the process of forming the low-resistance metal film by the wet film formation technique comprises the steps of:

making metal ions adsorbed onto the surface-modified ground resin film; and reducing the metal ions.

According to this embodiment, after metal ions are adsorbed to the ground resin film, the metal layer is formed by reducing the metal ions. That is, without using any dry film deposition technique or etching technique, the metal layer is formed selectively on the ground resin film with ease and lower cost. As a result, the fabrication of the metal wirings is facilitated while the fabrication cost for the metal wirings is reduced.

In one embodiment, the step of modifying the surface of the patterned ground resin film is a process using KOH (Potassium hydroxide).

According to this embodiment, even when the ground resin film is made of a material having strong chemical resistance such as polyimide, an etching process is done with KOH. Therefore, asperity is formed on the surface of the ground resin film, so that a good adhesion of the ground resin film with the low-resistance metal film can be obtained and that the metal ions can be adsorbed enough.

In one embodiment, the metal ions to be adsorbed onto the surface-modified ground resin film are any one of Cu, Ag and Pd ions.

According to this embodiment, these metal ions serve as a catalyst in the process of forming the low-resistance metal film by electroless plating as an example of the wet film formation technique, there is no need of imparting any catalyst for the plating process, so that the process for forming the low-resistance metal film can be reduced. Also, all these metal ions serve as a plating catalyst for the process of forming a low-resistance metal film of, for example, Cu on the ground resin film, the metal ions can be selected depending on the kind of the ground resin film or the conditions for the plating process.

In one embodiment, the step of reducing the metal ions is a process in which ultraviolet rays are irradiated to places where the low-resistance metal film is to be formed, by which the metal ions are selectively reduced.

According to this embodiment, the metal ions are reduced by irradiating ultraviolet rays, there is no need for a reducing agent, and so the liquid waste processing that would be involved in the use of a reducing agent is no longer necessary. Thus, the material cost for the reducing agent or the like and the liquid waste processing cost are reduced, so that the fabrication of metal wirings become easier and lower in price.

Further, the metal layer that serves as a catalyst in the process of forming the low-resistance metal film can be selectively formed by selectively reducing the metal ions of the ground resin film with the use of, for example, a mask. In this case, it becomes possible to form low-resistance metal film of different patterns on the patterned ground resin film.

The ground resin film to be formed in the present invention is preferably formed into a thickness of 0.05–0.5 $\mu$m. For example, in the case where metal wirings for an active matrix drive type LCD or the like are formed according to the present invention, if the ground resin film is thicker, there would occur such problems as disconnections at wiring jumping portions or occurrence of cracks at edge portions. With regard to the metal wirings of this active matrix drive type LCD, the total thickness of the metal wirings is desirably 0.5–0.8 $\mu$m at most, and therefore the thickness of the ground resin film is desirably not more than 0.5 $\mu$m at most. However, if the ground resin film is too thin, there would occur such problems as lowered adhesion between ground resin and insulating substrate, or dissipation of the ground resin film due to uniformities of etching depth in the etching process. Therefore, the thickness of the ground resin film is desirably not less than 0.05 $\mu$m.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinbelow, a metal wiring fabricating method of the present invention is described in detail by way of embodiments thereof illustrated in the accompanying drawings.

These embodiments are explained on the assumption that the metal wiring fabricating method of the invention is applied to the manufacture of an active matrix drive type LCD.

First Embodiment

Figure 1A:
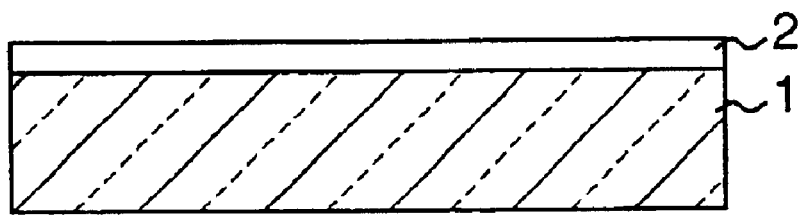
FIGS. 1A, 1B, 1C are process diagrams showing a method for fabricating metal wirings according to a first embodiment of the invention.
Figure 1B:
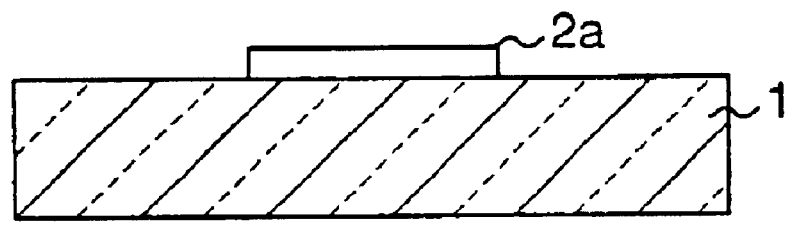
Figure 1C:
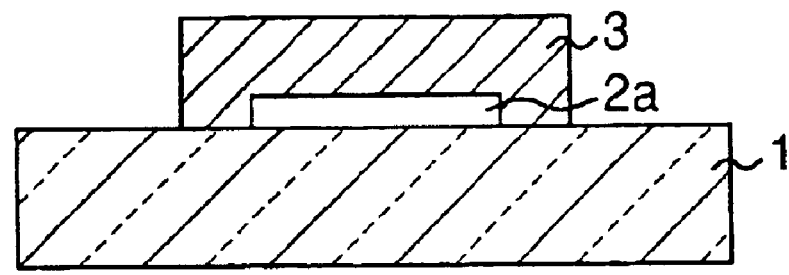

FIGS. 1A–1C are process diagrams of a first embodiment of the metal wiring fabricating method of the invention, where electroless plating is used as the wet film formation technique. In this case, a glass substrate (Corning 1373 Glass made by Corning Inc.) was used as an insulating substrate 1. It is noted that the insulating substrate referred to in this specification includes inorganic substrates such as glass substrates, ceramic substrates and semiconductor substrates or conductor substrates equipped with an insulating layer on the top surface, as well as various types of organic substrates or films of PET (Polyethylene Terephthalate), ABS (Alkylbenzene Sulphonate), PC (Polycarbonate) and the like. As the ground resin film, photosensitive polyimide (HD-6000 made by Hitachi Chemical—Du Pont) was used.
(First Step)

At this first step, as shown in FIG. 1A, a ground resin film 2 is formed by coating process on a top of the insulating substrate 1.

First, the top surface of the insulating substrate 1 is degreased and cleaned by alkali or acid or organic solvent. In this cleaning process, using ultrasonic waves in combination is effective. Then, after the insulating substrate 1 is dried, photosensitive polyimide is applied to a thickness of about 1.5 $\mu$m by using a spin coating application method, and further pre-baked (at 85° C. for 120 seconds), by which a ground resin film 2 is formed. In the active matrix drive type LCD, since the thickness of the whole metal wirings is desirably 0.5–0.8 $\mu$m at most, the thickness of the resin portion is desirably not more than 0.5 $\mu$m at most. The thinner the ground resin film 2 is, the thinner the metal wirings can be made and the better the resulting taper configuration becomes.

However, the resin portion may be made thick in cases where thicker film thicknesses are desired.

In addition, the ground resin referred to in this case may be made of novolak resin that is used as resist, polyimide-base or acrylic resin, epoxy resin that is used as printed wiring boards, and the like. However, any kind of resin may be used only if patterning and selective metal plating can be done on the resin.

Also, for ease of selective plating, the resins as described above with a plating catalyst contained therein may be used as in an embodiment.

However, the resin needs to be selected with sufficient consideration because of the difficulty in ensuring the adhesion between the ground resin film 2 and the plating material.
(Second Step)

Next, as shown in FIG. 1B, the ground resin film obtained by the first step is subjected to exposure and development processes, thereby patterned into a wiring pattern. More specifically, as in the patterning of resist, after the ground resin film 2 is exposed to light (exposure level: 400 mJ/cm$^2$) by using a photomask with exposure equipment such as a stepper, a development process (for 50 seconds at room temperature) is performed with an alkali developer (PL-DEVELOPER-2N made by Hitachi Chemical—Du Pont), and then a baking process (for 60 min at 300° C.) is done. The film thickness of photosensitive polyimide at this time point is about 0.5 μm. This film thickness can be easily controlled by the rotation number of the spinner for the spin coating.

Photosensitive resins that can be patterned by exposure and development processes are optimal in terms of cost reduction and process simplification.

In addition, the ground resin referred to in this case may be made of novolak resin that is used as resist, polyimide-base or acrylic resin, epoxy resin that is used as printed wiring boards, and the like. However, any kind of photosensitive resin may be used only if selective wet film formation can be done on the resin.

However, the resin needs to be selected with sufficient consideration because of the difficulty in ensuring the adhesion between the ground resin and the plating material.

(Third Step)

Next, as shown in FIG. 1C, on the top surface of the ground resin film 2a patterned into a wiring pattern, a low-resistance metal film 3 is formed by electroless plating. In this case, Cu plating was used as the electroless plating, and Melplate Cu-390 made by Meltex Company was used as the plating solution. With this plating solution, a 10-min plating process was performed at a solution temperature of 40°, by which a Cu thin film having a film thickness of 0.2 μm was obtained. The metal film to be formed by electroless plating may be made of copper, nickel, tin, gold, silver, chromium, palladium, or the like. The thickness of this metal film may be set optionally by changing the immersion time into the plating solution.

For metal wirings in active matrix drive type LCDs, Cu is optimal in terms of material cost, resistance value, resistance to electromigration, and the like. Forming a film of Cu at a film thickness of 0.2–0.5 μm allows sufficiently low resistance for wirings, or interconnections, to be obtained.

Even in the case where there is no room for selection of the ground resin and where a low adhesion between the ground resin and the plated Cu is involved, low-resistance wirings having a good adhesion with the ground resin can be implemented by laying Ni, which allows the adhesion with the ground resin to be taken relatively easily, on the ground resin, and further thereon laying Cu/Au or the like.

Although electroless plating is used to form the low-resistance metal film in this embodiment, other wet film formation techniques such as electrolytic plating and electrodeposition may also be used. Using electrolytic plating allows a higher quality film of better adhesion with the ground film to be obtained, as compared with electroless plating.

As shown above, the metal wiring fabricating method of the first embodiment is capable of simplifying the manufacturing process to a large extent and fabricating the metal wirings with low cost as described below, as compared with the conventional method in which metal film of Ta or the like is used as the ground film and a low-resistance metal film is formed thereon.

Prior art manufacturing method: dry film formation process of ground metal film of Ta→photolithography process for patterning of ground metal film of Ta (resist coating, exposure, development)→etching (dry etching for Ta)→dry film formation process of low-resistance metal film of Cu photolithography process for patterning of low-resistance metal film of Cu (resist coating, exposure, development)→etching (wet etching of Cu).

First embodiment manufacturing method: coating process of ground resin film photolithography process for patterning of ground resin film (exposure, development)→electroless selective plating process of low-resistance metal film of Cu.

The plating process used in the first embodiment is electroless selective plating (in which no current is passed through the plating solution or the substrate, the metal film can be formed only by immersing the substrate into the solution) thus making it easy to treat large-scale substrates.

Figure 2:
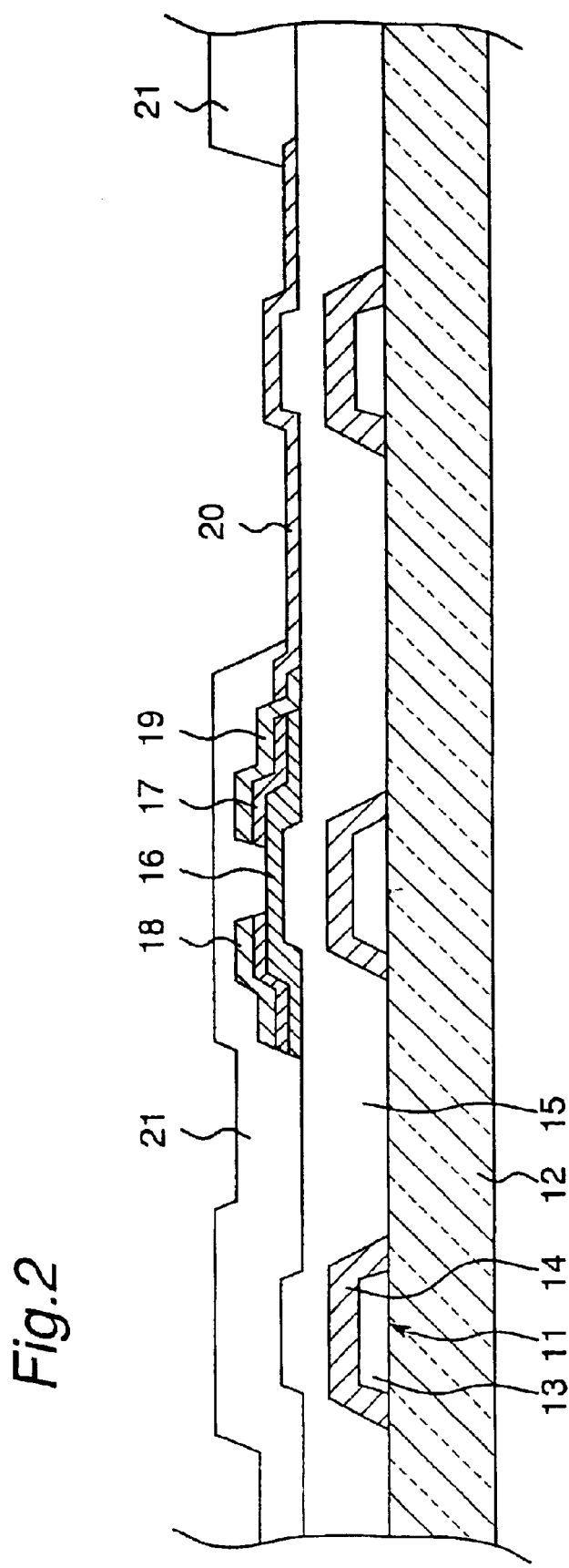
FIG. 2 is a sectional view of a thin film transistor (TFT) in which the metal wirings obtained by the manufacturing flow shown in FIGS. 1A–1C are applied to an active matrix substrate.

FIG. 2 shows a cross-sectional structure of a thin film transistor (TFT) in which metal wirings manufactured by the fabrication process shown in FIGS. 1A–1C are applied to an active matrix substrate.

A gate line 11 is formed of a photosensitive polyimide film 13 as a ground resin film and a low-resistance metal film 14 made of Cu, on a glass substrate 12 which is an insulating substrate. Sheet resistance of this lamination film 11 is not more than 0.1 Ω/□. On the gate line 11, a gate insulator 15 made of SiNx is formed by CVD process (Chemical Vapor Deposition). Further on the gate insulator 15, are provided an a—Si film 16 as a channel portion, an n$^+$-type a—Si film 17 as a contact layer, a source electrode 18 and a drain electrode 19 made of Al, a pixel electrode 20 made of ITO, and an insulating overcoat 21 made of SiNx.

It was verified that the TFT device obtained in this way exhibit characteristics similar to those of conventional TFT devices using a gate line formed only by conventional dry film deposition. Thus, it was verified that the first embodiment is applicable to active matrix drive type LCDs.

Second Embodiment

In a second embodiment of the metal wiring fabricating method of the present invention, a plating technique and a film formation technique shown in Japanese Patent Laid-Open Publication HEI 10-245444 are used as wet film formation techniques.

At first and second steps, processes similar to those of the first embodiment are performed.

However, photosensitive polyimide is used as the resin for the first step. The surface of this polyimide is sulfonated by sulfuric acid in hydrogen peroxide solution or acetic anhydride, by which sulfo groups are introduced to the surface of the polyimide. Through neutralization of this, the sulfo groups are treated by a metal-ion containing solution so as to be transformed into metal salts of sulfo groups. The resulting metal ions are reduced so that a metal coating is formed on the surface of polyimide. By the method described above, a film of Cu is formed on the surface of the polyimide resin.

In this case, in order to make this film further lower in resistance, a film thickening process for the film of Cu was performed by using a plating technique, so that Cu/polyimide surface resistance was set to 0.1 Ω/□.

According to this method, a film which has no problems in terms of resistance for use as wiring lines for large-scale, high-definition flat panel displays can be fabricated.

Also, by virtue of the use of polyimide, which is higher in heat resistance and chemical resistance as a resin film, such applications to TFTs as described in the first embodiment are allowed with ease also in the second embodiment.

Third Embodiment

This third embodiment includes, in addition to the steps of the metal wiring fabricating method of the first embodiment, a step for modifying the surface of the ground resin film.

Figure 3A:
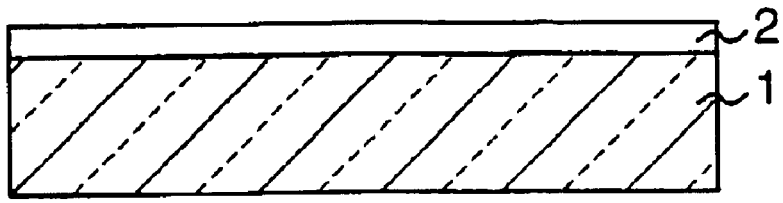
FIGS. 3A, 3B, 3C and 3D are process diagrams showing a method for fabricating metal wirings according to a third embodiment of the invention.
Figure 3B:
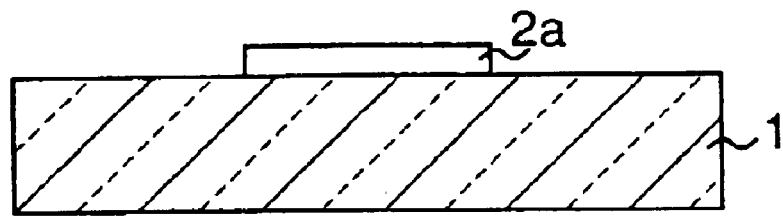
Figure 3C:
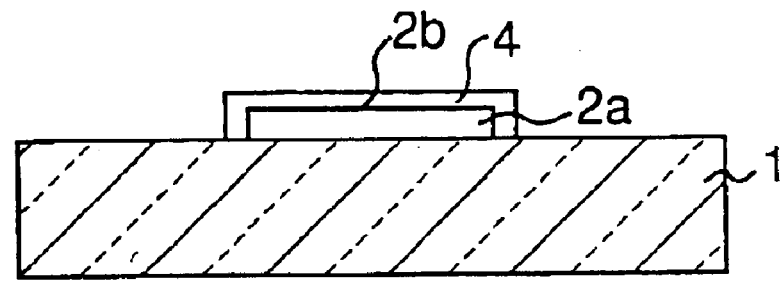

FIGS. 3A, 3B, 3C are process diagrams showing a method for fabricating metal wirings according to the third embodiment, where electroless plating is used as a wet film formation technique.

(First Step)

At a first step shown in FIG. 3A, after the surface of an insulating substrate 1 is cleaned and dried, photosensitive polyimide is applied to a thickness of 2.6 $\mu$m and then pre-baked (at 85° C. for 120 seconds), by which a ground resin film 2 is formed.

(Second Step)

Next, at a second step shown in FIG. 3B, the ground resin film 2 is patterned. More specifically, the ground resin film 2 made of photosensitive polyimide is exposed to light (exposure level: 400 mJ/cm$^2$) by using a photomask with exposure equipment such as a stepper.

Thereafter, a development process (for 50 seconds at room temperature) is performed with an alkali developer (PL-DEVELOPER-2N made by Hitachi Chemical—Du Pont), and then a baking process (for 60 min at 300° C.) is done. The film thickness of a patterned ground resin film 2a at this time point is about 1 $\mu$m.

(Third Step)

Next, as shown in FIG. 3C, after the surface of the ground resin film 2a patterned into a wiring pattern is modified, a metal layer 4 is formed.

First, the ground resin film 2a made of photosensitive polyimide is immersed into a KOH solution (5 mol/L) (at 50° C. and for 5 min.), thereby its surface being modified to have asperity. Through treatment with KOH, amide bonds and carboxyl groups, which are cation-exchange groups of photosensitive polyimide resin, are formed. It is noted that the film thickness of the ground resin film 2a at this time point is 0.3 $\mu$m.

Next, the insulating substrate 1 having the patterned ground resin film 2a is immersed into an AgNO$_3$ solution at room temperature and for 1 min. In this process, Ag ions are adsorbed to the modified surface 2b of the ground resin film 2a by ion exchange reaction. Thereafter, the insulating substrate 1 having the ground resin film 2a is irradiated with ultraviolet rays (for two hours by a 140 W low-pressure mercury lamp), thereby making Ag ions reduced, by which a Ag layer 4 as the metal layer is formed on the ground resin film 2a.

Although the Ag layer 4 is formed as the metal layer in this embodiment, Cu, Pd or the like other than Ag id may be used, and any metal layer will do only if the metal layer acts as a catalyst in electroless plating for forming a low-resistance metal film during the subsequent process. Also, when the low-resistance metal film is deposited by electroplating, a metal layer having such a low electric resistance that the surface resistance distribution becomes smaller is preferable.

Also in this embodiment, ultraviolet rays are irradiated to the entire surface of the insulating substrate 1, so that the Ag ions that have been adsorbed to the modified surface 2b of the ground resin film 2a are reduced. Alternatively, Ag ions may be selectively reduced by selectively irradiating ultraviolet rays, for example, with a mask or the like. In this case, the low-resistance metal film is not deposited at portions where Ag ions have not been reduced, low-resistance metal wirings with different constitutions can be formed on the patterned ground resin film 2a. Further, Ag ions may be reduced by using a reducing agent without using ultraviolet rays.

(Fourth Step)

Figure 3D:
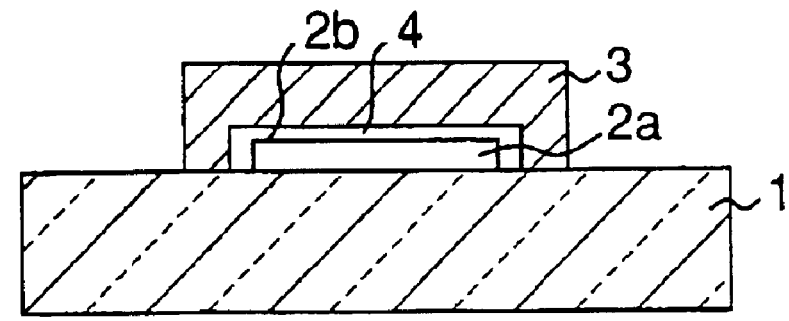

Next, as shown in FIG. 3D, a low-resistance metal film 3 is formed by electroless plating on the surface of the ground resin film 2a. In this case, Cu plating was used as the electroless plating, and Melplate Cu-390 made by Meltex Company was used as the plating solution. With this plating solution, a 10-min plating process was performed at a solution temperature of 40°, by which a Cu thin film having a film thickness of 0.2 $\mu$m was obtained. The Ag layer 4 at the surface of the ground resin film 2a acts as a catalyst for Cu deposition. In this embodiment, because the Ag layer 4 was formed on the entire surface of the ground resin film 2a, Cu was deposited as the low-resistance metal film 3 on the entire surface of the ground resin film 2a.

In this embodiment, the film thickness of photosensitive polyimide, which is the ground resin film 2a, is about 0.3 $\mu$m and the film thickness of the Cu thin film, which is the low-resistance metal film 3, is about 0.2 $\mu$m. The sum of the thickness of the ground resin film 2a and the thickness of the low-resistance metal film 3, i.e., the total thickness of the metal wirings is about 0.5 $\mu$m. These metal wirings are preferable as metal wirings of a thin film transistor (TFT) having the cross-sectional structure shown in FIG. 2. That is, since the thickness of the whole metal wirings is about 0.5 $\mu$m, which is an optimum thickness that makes it possible to avoid such problems as disconnections at wiring jumping portions or occurrence of cracks at edge portions, an active matrix drive type LCD superior in display grade can be realized.

Although the surface of the patterned ground resin film 2a is modified after the patterning of the ground resin film 2 in this embodiment, the surface of the ground resin film 2 prior to the patterning may be modified.

The present invention is suitable for flat panel displays such as liquid crystal displays (LCDS), plasma display panels (PDPs), electrochromic displays (ECDs) and electroluminescent displays (ELDs), and quite effective for cases where reduction in manufacturing cost by manufacturing process reduction or the use of Cu for lowering the wiring resistance is desired, and where wet film formation is desired in place of dry film deposition with a view to the saving of resources.

Further, the present invention is not limited to the method for fabricating metal wirings for flat panel displays, and may be widely used as a method for fabricating metal wirings in other fields.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for fabricating metal wirings, comprising the steps of:

forming a ground resin film by applying a resin onto an insulating substrate;

patterning the ground resin film; and forming a low-resistance metal film selectively over the patterned ground resin film by a wet film formation technique wherein the patterned ground resin film is enclosed by the low-resistance metal film and the insulating substrate, wherein the low-resistance metal film is a single layer film containing any one of Cu, Ni, Sn, Au, Ag, Cr, or Pd or the low-resistance metal film is a multilayer film containing at least one single layer film containing Cu, Ni, or Au, thereby forming said metal wiring without using any etching technique.

2. A method according to claim 1, wherein the ground resin film is made of a photosensitive resin that can be patterned by exposure and development.

3. A method according to claim 1, wherein the ground resin film is made of polyimide.

4. A method according to claim 1, wherein plating is used as the wet film formation technique, and the ground resin contains a plating catalyst.

5. A method according to claim 1, further comprising:
  a step for, before the step of forming the low-resistance metal film, modifying a surface of the ground resin film.

6. A method according to claim 5, further comprising:
  a set for, after the step of modifying the surface of tho patterned ground resin film, forming on the surface-modified ground resin film a metal layer serving as a catalyst in the process of forming the low-resistance metal film by the wet film formation technique.

7. A method according to claim 6, wherein the step of forming the metal layer acting as a catalyst in the process of forming the low-resistance metal film by the wet film formation technique comprises the steps of:

making metal ions adsorbed onto the surface-modified ground resin film; and
  reducing the metal ions.

8. A method according to claim 5, wherein the ground resin film is made of a photosensitive resin which can bo patterned by exposure and development.

9. A method according to claim 5, wherein the ground resin film is made of polyimide.

10. The metal wiring fabricating method according to claim 9, wherein the step of modifying the surface of the patterned ground resin film is a process using KOH.

11. A method according to claim 7, wherein
  the metal ions to be adsorbed onto the surface-modified ground resin are any one of Cu, Ag and Pd ions.

12. A method according to claim 7, wherein
  the step of reducing the metal ions is a process in which ultraviolet rays are irradiated to places where the low-resistance metal film is to be formed, by which the metal ions are selectively reduced.

13. The method according to claim 1, wherein the ground resin film has a thickness of between 0.05 $\mu$m and 0.5 $\mu$m.

* * * * *